United States Patent
Mulders et al.

(10) Patent No.: US 11,661,196 B2
(45) Date of Patent: May 30, 2023

(54) OPTIMIZED ELECTRONICS GROUNDING PATH FOR HIGH-FREQUENCY NOISE

(71) Applicant: Koninklijke Fabriek Inventum B. V., Nieuwegein (NL)

(72) Inventors: Dennis Mulders, Etten-Leur (NL); Lubbertus van den Esker, Genemuiden (NL); Marcus M. C. Jaspers, Woerden (NL)

(73) Assignee: B/E Aerospace, Inc., Winston-Salem, NC (US)

( * ) Notice: Subject to any disclaimer, the term of this patent is extended or adjusted under 35 U.S.C. 154(b) by 891 days.

(21) Appl. No.: 16/451,397

(22) Filed: Jun. 25, 2019

(65) Prior Publication Data
US 2021/0291986 A1    Sep. 23, 2021

(51) Int. Cl.
*B64D 11/04* (2006.01)
*F24C 15/16* (2006.01)
*H05K 9/00* (2006.01)

(52) U.S. Cl.
CPC ............. *B64D 11/04* (2013.01); *F24C 15/16* (2013.01); *H05K 9/0007* (2013.01)

(58) Field of Classification Search
None
See application file for complete search history.

(56) References Cited

U.S. PATENT DOCUMENTS

| | | | | |
|---|---|---|---|---|
| 6,348,654 B1 * | 2/2002 | Zhang | ............... | H05K 9/0015 |
| | | | | 174/362 |
| 6,809,169 B2 * | 10/2004 | Byrd | ............... | C08G 18/61 |
| | | | | 428/447 |
| 6,914,219 B2 * | 7/2005 | Kuhne | ............... | F24C 15/322 |
| | | | | 219/400 |
| 7,829,825 B2 * | 11/2010 | Kuhne | ............... | F24C 15/327 |
| | | | | 99/468 |

(Continued)

FOREIGN PATENT DOCUMENTS

| EP | 0806892 B1 | 6/1999 |
|---|---|---|
| EP | 2338792 A3 | 7/2013 |

(Continued)

OTHER PUBLICATIONS

Search Report for European Application No. 20150785.2 dated Dec. 30, 2020, 2 pages.

*Primary Examiner* — Rockshana D Chowdhury
*Assistant Examiner* — Douglas R Burtner
(74) *Attorney, Agent, or Firm* — Suiter Swantz pc llo

(57) ABSTRACT

An aircraft galley insert is disclosed. In one or more embodiments, the aircraft galley insert includes a control unit including a control unit housing. The aircraft galley insert further includes one or more electronic components at least partially contained within the control unit housing, wherein at least one electronic component of the one or more electronic components is coupled to the control unit housing. The aircraft galley insert further includes one or more operating load components electrically coupled to the at (Continued)

least one electronic component via one or more electrical lines. In one or more embodiments, the control unit housing is configured to provide a grounding path for radiated emissions produced by the at least one electronic component by transferring radiated emissions back to the at least one electronic component.

12 Claims, 12 Drawing Sheets

(56) References Cited

U.S. PATENT DOCUMENTS

| | | | | |
|---|---|---|---|---|
| 8,686,876 B2* | 4/2014 | Shiomori | ........... | B64D 11/0015 340/963 |
| 9,188,380 B2* | 11/2015 | Lu | ........... | G05D 23/00 |
| 9,238,398 B2* | 1/2016 | Lu | ........... | F25D 15/00 |
| 9,676,483 B2* | 6/2017 | Godecker | ........... | F25D 17/02 |
| 2002/0185292 A1* | 12/2002 | Ariel | ........... | F16J 15/064 174/388 |
| 2003/0042361 A1* | 3/2003 | Simadiris | ........... | F25D 11/003 62/434 |
| 2004/0165368 A1* | 8/2004 | Norte | ........... | H05K 9/0067 361/816 |
| 2007/0206355 A1* | 9/2007 | Testin | ........... | G06F 1/185 165/80.3 |
| 2009/0207579 A1* | 8/2009 | Boetto | ........... | H05K 9/0016 361/818 |
| 2010/0071384 A1* | 3/2010 | Lu | ........... | F25D 15/00 62/3.2 |
| 2010/0155391 A1* | 6/2010 | Koschberg | ........... | B64D 11/04 219/391 |
| 2013/0048264 A1* | 2/2013 | Lu | ........... | G05D 23/00 165/200 |
| 2013/0255656 A1* | 10/2013 | Schootstra | ........... | F24C 15/026 126/190 |
| 2013/0255657 A1* | 10/2013 | Schootstra | ........... | F24C 15/322 126/21 A |
| 2013/0255662 A1* | 10/2013 | Schootstra | ........... | F24C 15/162 126/340 |
| 2014/0263835 A1* | 9/2014 | Godecker | ........... | B64D 13/08 244/118.5 |
| 2014/0368030 A1* | 12/2014 | Burd | ........... | B64D 11/04 307/9.1 |
| 2017/0029115 A1* | 2/2017 | Burd | ........... | B64D 11/04 |
| 2017/0112020 A1* | 4/2017 | Krivonak | ........... | H05K 7/20927 |

FOREIGN PATENT DOCUMENTS

| EP | 3757006 A1 | 12/2020 |
|---|---|---|
| JP | 2002246787 A | 8/2002 |

* cited by examiner

OPTIMIZED ELECTRONICS GROUNDING PATH FOR HIGH-FREQUENCY NOISE

BACKGROUND

Electronic components of appliances and other electronic devices commonly generate electromagnetic interference (EMI). High-frequency noise (e.g., EMI) emitted by electronic components, such as appliances, may interfere with the efficient operation of other nearby electronic components. Accordingly, the minimization and control of EMI (e.g., radiated emissions (RE)) generated by appliances and other electronic devices is especially important in the context of aviation. In particular, many currently available aircraft galley ovens are not manufactured with optimized grounding paths for high-frequency noise emitted by the electrical components of the aircraft ovens. Therefore, it would be desirable to provide a system which cures one or more of the shortfalls of the previous approaches identified above.

SUMMARY

An aircraft galley insert is disclosed. In one or more embodiments, the aircraft galley insert includes a control unit including a control unit housing. The aircraft galley insert further includes one or more electronic components at least partially contained within the control unit housing, wherein at least one electronic component of the one or more electronic components is coupled to the control unit housing. The aircraft galley insert further includes one or more operating load components electrically coupled to the at least one electronic component via one or more electrical lines. In one or more embodiments, the control unit housing is configured to provide a grounding path for radiated emissions produced by the at least one electronic component by transferring radiated emissions back to the at least one electronic component.

In one or more additional embodiments, an aircraft galley insert is disclosed. The aircraft galley insert includes a galley insert body installable in a galley of an aircraft, the galley insert body including an outer cover. The aircraft galley insert further includes a control unit including a control unit housing coupled to the outer cover. The aircraft galley insert further includes one or more electronic components at least partially contained within the control unit housing, wherein at least one electronic component of the one or more electronic components is coupled to the control unit housing. The aircraft galley insert further includes one or more operating load components electrically coupled to the at least one electronic component via one or more electrical lines, the one or more operating load components further coupled to the outer cover. In one or more embodiments, the control unit housing is configured to provide a grounding path for radiated emissions produced by the at least one electrical component by transferring radiated emissions from the outer cover back to the at least one electronic component.

In one or more additional embodiments, a method for an optimized grounding path is disclosed. In embodiments, the method may include: coupling one or more electronic components of an aircraft galley insert to a control unit housing; coupling one or more operating load components to one or more conductive coupling structures; coupling the control unit housing to the one or more conductive coupling structures; electrically coupling the one or more electronic components to the one or more operating load components via one or more electrical lines; transferring radiated emissions produced by the one or more electronic components from the one or more conductive coupling structures to the control unit housing via at least one of a capacitive coupling or a conductive coupling between the one or more conductive coupling structures and the control unit housing; and transferring the radiated emissions from the control unit housing to the one or more electronic components via at least one of a capacitive coupling or a conductive coupling between the control unit housing and the one or more electronic components.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Figure 1:
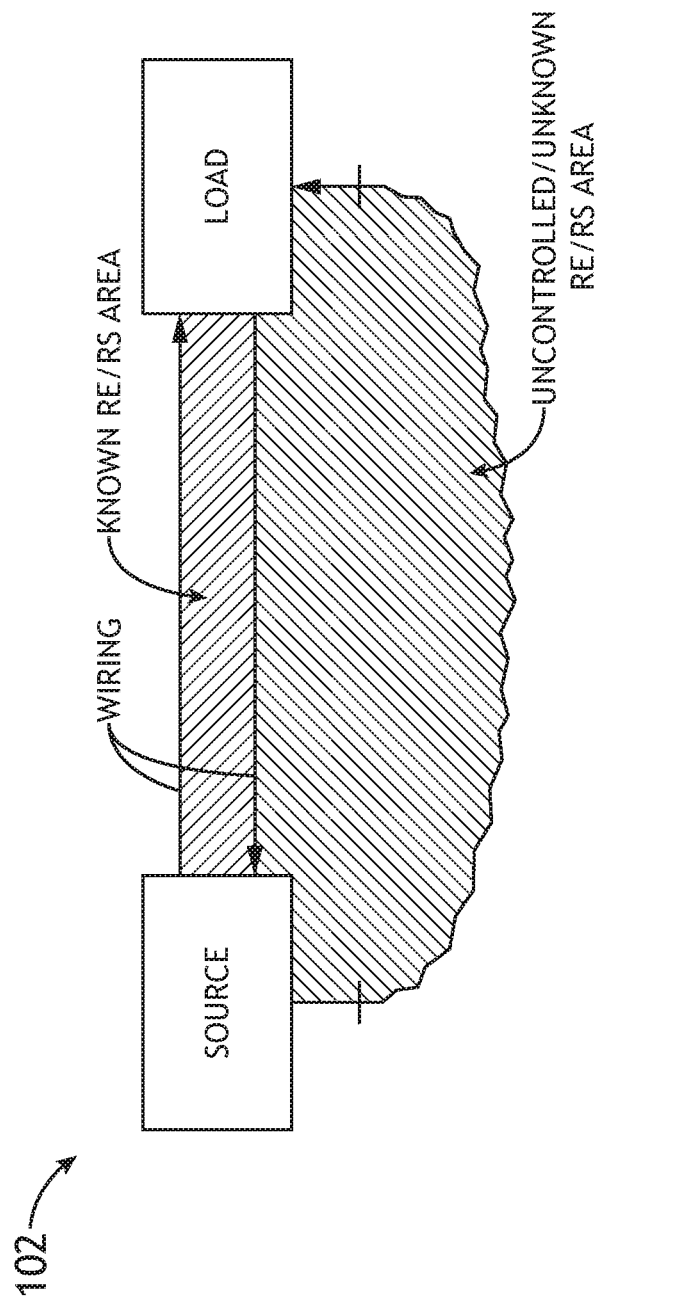
FIG. 1 illustrates a simplified view of a non-optimized grounding path of an electronic device.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein, directional terms such as "top," "bottom," "over," "under," "upper," "upward," "lower," "down," "downward," and similar terms, are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Additionally, as used herein, a letter following a reference numeral is intended to reference an embodiment of the feature or element that may be similar, but not necessarily identical, to a previously described element or feature bearing the same reference numeral (e.g., 1, 1A, 1B). Such shorthand notations are used for purposes of convenience only, and should not be construed to limit the inventive concepts disclosed herein in any way unless expressly stated to the contrary.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

As noted previously herein, electronic components of appliances and other electronic devices commonly generate electromagnetic interference (EMI). High-frequency noise (e.g., EMI) emitted by electronic components, such as appliances, may interfere with the efficient operation of other nearby electronic components. The minimization and control of EMI generated by appliances and other electronic devices is especially important in the context of aviation. One approach to limiting radiated emissions (RE) (e.g., unintentional releases of electromagnetic energy) and radiated susceptibility (RS) is based on the principle of limiting and controlling the area that introduces emissions (e.g., EMI) and makes a system susceptible. In order to control the area of a system which introduces emissions and to prevent EMI, unwanted noise (e.g., RE) may be directed back to the source of the EMI, such that a noise path and noise return path is created between the source of EMI within a system and the load of the system. In this regard, manufacturing electronic devices with efficient, optimized return paths between a power source and load which are unobstructed as possible is crucial to the minimization of EMI and RE.

In the context of aerospace products, such as aircraft galley inserts and appliances, allowed RE levels are low, while RS levels are high. Therefore, the manufacture of aerospace electronic devices (e.g., galley inserts) with efficient/optimized noise grounding paths between EMI sources (e.g., power supply modules) and loads (e.g., pumps, valves, motors, human machine interfaces (HMI), heating elements, cooling elements, and the like) is highly important. However, many currently available electronic devices, including galley inserts (e.g., galley ovens, and the like) are not manufactured with optimized grounding paths for high-frequency noise emitted by the electrical components (e.g., RE). In this regard, many currently available electronics devices may include an uncontrolled area of RE and RS, which leads to unwanted EMI emissions.

FIG. 1 illustrates a simplified view of a non-optimized grounding path of an electronic device. In this regard, FIG. 1 may be provided as an example of a non-optimized grounding path of currently available electronic devices, against which embodiments of the present disclosure may be compared.

In particular, currently available aircraft galley inserts, including aircraft galley ovens 102, provide sub-optimal grounding paths for returning high-frequency noise (e.g., RE) emitted by the electrical components of the galley inserts. For example, as shown in FIG. 1, in many electronic devices (e.g., aircraft galley oven 102), an electronic power source (e.g., power supply modules) and load (e.g., pumps, valves, human machine interfaces, and the like) of the electronic device (aircraft galley oven 102) are coupled via power and return wiring. A majority of the current and noise will typically flow within the power and the return wiring, thus the area between the power and return wiring is typically kept as small as possible to reduce the known area of RE and RS ("Known RE/RS area"). However, even by minimizing the known RE/RS area, the return path for noise back to the source typically is not optimal due to mutual capacitance. Accordingly, a portion of the current/noise within the electronic device will travel back to the source by any number of return paths as uncontrolled radiated emissions (RE), leading to large, uncontrolled areas of RE ("Uncontrolled/Unknown RE/RS area"), thereby making the electronic device more susceptible.

Furthermore, current aircraft galley inserts often utilize oven control unit housings which exhibit high resistances, thereby inhibiting the return RE and EMI back to electronic components of the aircraft galley inserts. Additionally, current galley insert designs include many components, and therefore many transitions between components/parts which are physically different (e.g., "surface jumps") along grounding paths, thereby increasing the size of the uncontrolled/unknown RE/RS area, increasing bonding resistance, and further inhibiting the return of high-frequency noise (e.g., RE) back to the source. Furthermore, contact surfaces along the grounding path of current galley inserts are typically small, limiting the ability of the grounding path to return RE via capacitive coupling. Therefore, it would be desirable to provide a system which cures one or more of the shortfalls of the previous approaches identified above.

Accordingly, embodiments of the present disclosure are directed to a grounding path for electronic devices (e.g., galley inserts, galley ovens) which reduces the length of the grounding path, reduces the number of "surface jumps" along the grounding path, increases the area of contact surfaces in order to optimize the efficiency of the grounding path, and reduces the uncontrolled area of radiated emissions (RE) within electronic devices.

Figure 2:
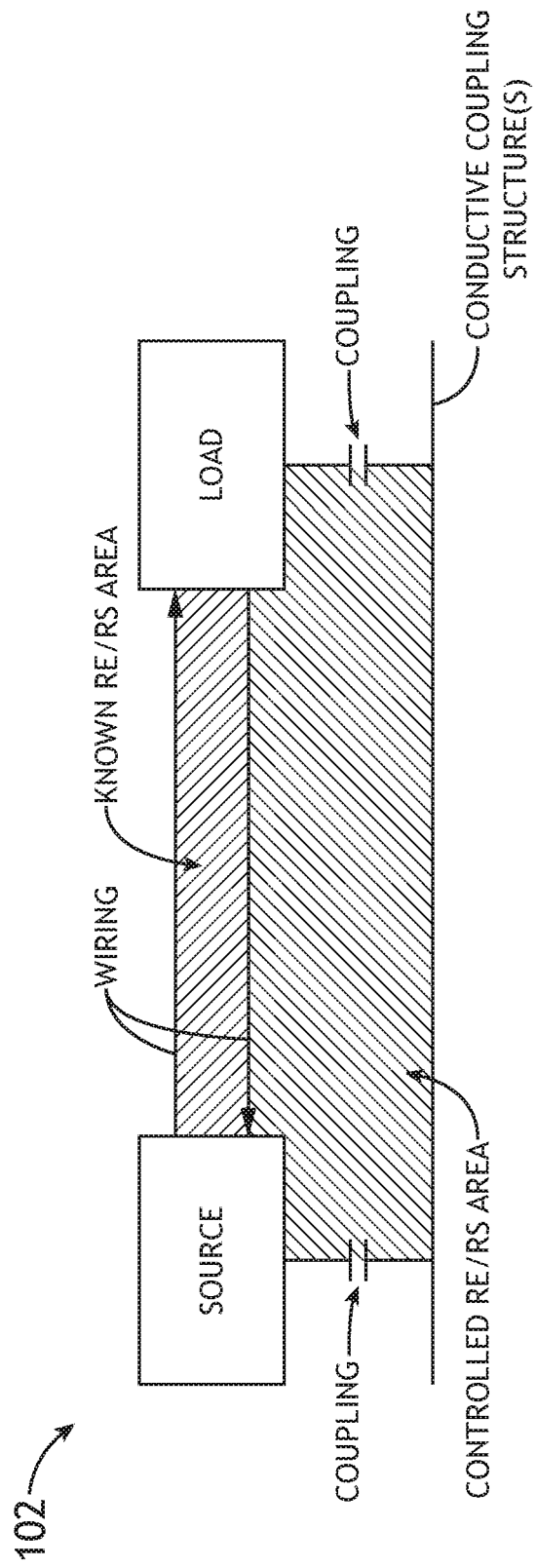
FIG. 2 illustrates a simplified view of an optimized grounding path of an electronic device, in accordance with one or more embodiments of the present disclosure.

FIG. 2 illustrates a simplified view of an optimized grounding path of an electronic device, in accordance with one or more embodiments of the present disclosure. Some embodiments of the present disclosure are directed to reducing and controlling the uncontrolled/unknown RE/RS area shown in FIG. 1. In this regard, some embodiments of the present disclosure are directed to coupling a source and a load of an electronic device to one or more conductive coupling structures in order to create a known, controlled RE/RS area for radiated emissions (RE) to return to the source. In embodiments, a source and load of an electronic device (e.g., aircraft galley oven 102) may be coupled to one or more conductive coupling structures using any coupling technique known in the art including, but not limited to, capacitive coupling (shown in FIG. 2), conductive coupling, and the like. Additionally, the one or more coupling structures may include any conductive coupling structures of the electronic device known in the art including, but not limited to, a control unit housing, an outer cover, a conductive structural component, and the like. By reducing and controlling the area which contributes to radiated emissions (RE) (e.g., "Controlled RE/RS area"), high-frequency noise (e.g., EMI) emitted by an electronic device (e.g., galley insert) may be reduced, and the radiated susceptibility of the electronic device may be improved.

Broadly, embodiments of the inventive concepts disclosed herein are directed to an optimized electronics grounding path for radiated emissions (RE). More particularly, embodiments of the present disclosure are directed to an optimized grounding path for high-frequency noise (e.g., RE) generated by electronic devices (e.g., galley inserts, and the like). Additional embodiments of the present disclosure are directed to electronic devices which utilize structural components of the electronic device as conductive coupling structures (e.g., chassis, frame, control unit housing, outer cover, and the like) to create optimized and defined grounding paths which direct EMI (e.g., RE) back to various power sources. Further embodiments of the present disclosure are directed to a galley insert with an optimized grounding path for high-frequency noise.

Figure 3:
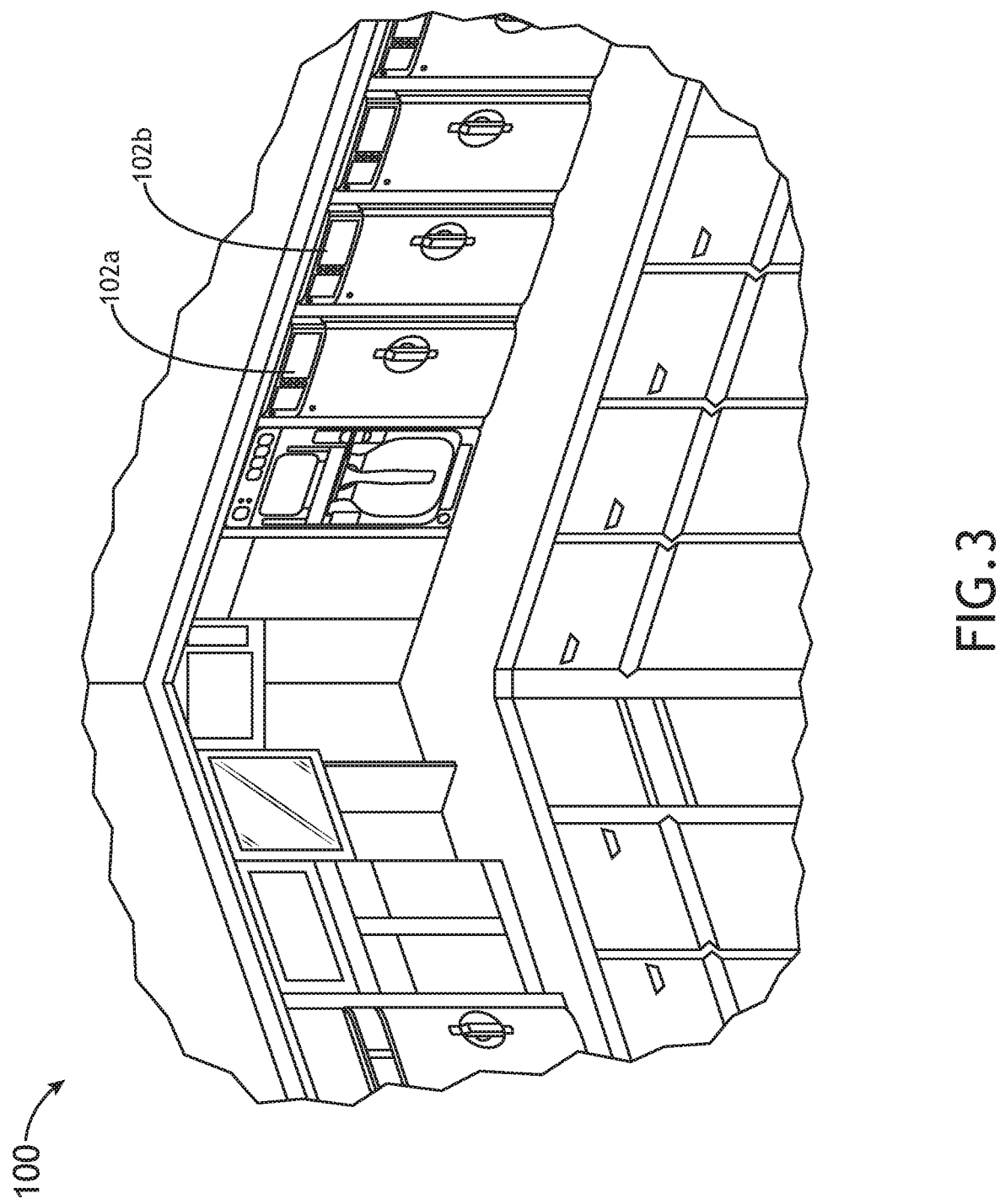
FIG. 3 illustrates an aircraft environment including aircraft-compliant appliances, in accordance with an example embodiment of the present disclosure.

FIG. 3 illustrates an aircraft environment 100 including aircraft-compliant galley inserts, in accordance with an example embodiment of the present disclosure. More specifically, FIG. 3 illustrates an aircraft environment 100 (e.g., aircraft galley) including various galley inserts (e.g., aircraft-compliant galley coffee maker, and a plurality of aircraft galley ovens 102*a*, 102*b*).

It is noted herein that much of the present disclosure is shown and described in the context of an aircraft galley oven 102 within an aircraft environment 100. However, this is not to be regarded as a limitation of the present disclosure, unless noted otherwise herein. In this regard, the inventive concepts of the present disclosure may be applied in any type of electronic device or galley insert known in the art. For example, inventive concepts of the present disclosure may be used to optimize grounding paths within non-aircraft appliances, including commercial appliances, residential appliances, and the like. By way of another example, inventive concepts of the present disclosure may be used in the context of alternative and/or additional galley inserts including, but not limited to, coffee makers, beverage carts, chillers, trash compactors, and the like.

It is further noted herein that, where the environment includes an aircraft environment, the embodiments of the present disclosure may be configured in accordance with avionics guidelines and/or standards put forth by, but not limited to, the Federal Aviation Administration (FAA), the European Aviation Safety Agency (EASA) or any other flight certification agency or organization; the American National Standards Institute (ANSI), Aeronautical Radio, Incorporated (ARINC), or any other standards setting organization or company; the Radio Technical Commission for Aeronautics (RTCA) or any other guidelines agency or organization; or the like.

Figure 4A:
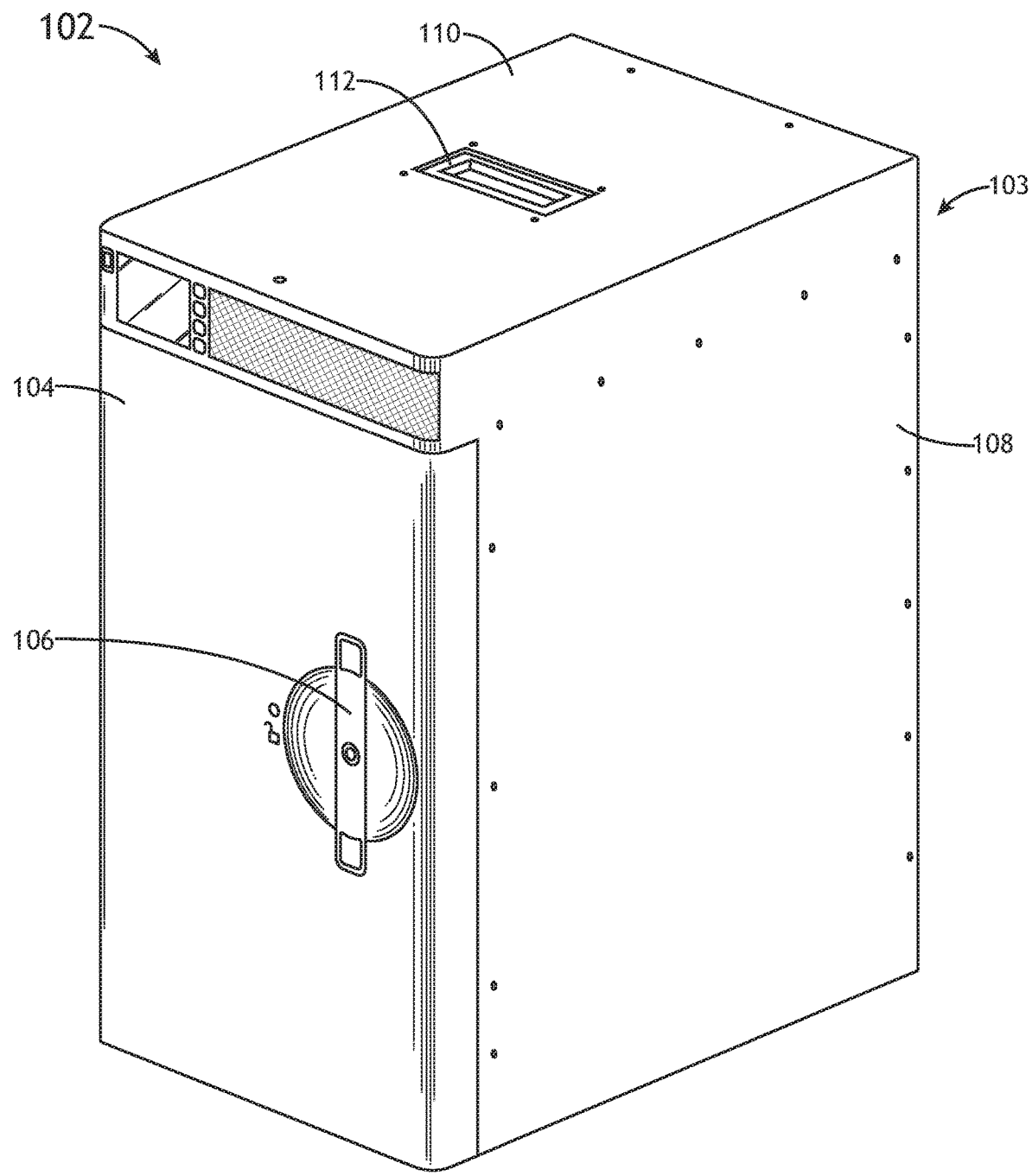
FIG. 4A illustrates a front perspective view of an aircraft oven, in accordance with an example embodiment of the present disclosure.

FIG. 4A illustrates a front perspective view of an aircraft galley oven 102, in accordance with an example embodiment of the present disclosure. The aircraft galley oven 102 may include, but is not limited to, an oven body 103 and an oven door 104 hingedly coupled to the oven body 103.

The oven door 104 may include a handle 106. In embodiments, the oven body 103 includes an outer cover 108 defining one or more exterior surfaces of the oven body 103. The oven body 103 may further include a top cover 110 defining a top exterior surface of the oven body 103. In embodiments, the top cover 110 may be configured to detachably couple to the outer cover 108. The top cover 110 may include one or more structures configured to facilitate carrying and movement of the aircraft galley oven 102. For example, as shown in FIG. 4A, the top cover 110 may include one or more handles 112.

Figure 4B:
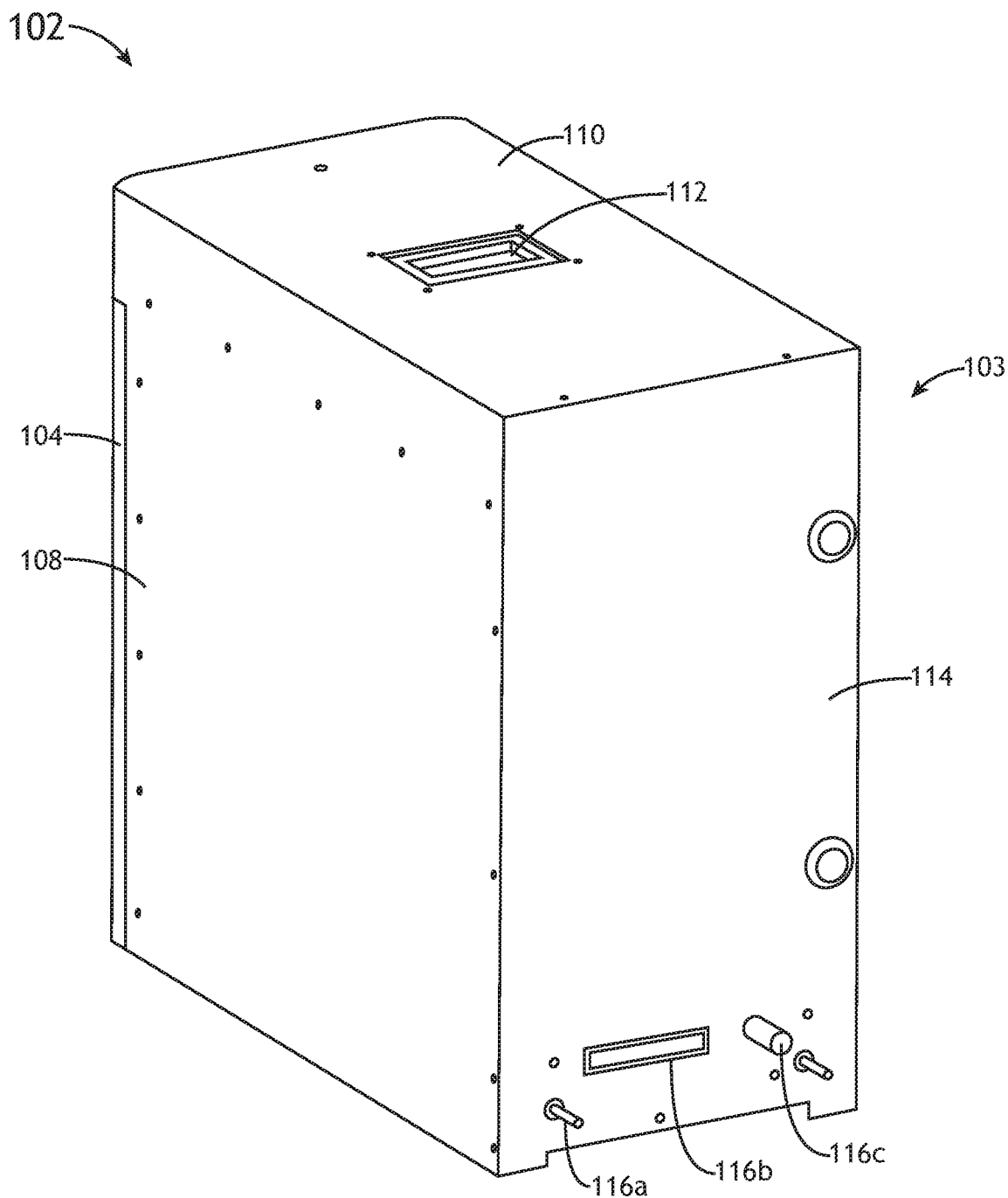
FIG. 4B illustrates a rear perspective view of an aircraft oven, in accordance with an example embodiment of the present disclosure.

FIG. 4B illustrates a rear perspective view of an aircraft galley oven 102, in accordance with an example embodiment of the present disclosure. In embodiments, aircraft galley oven 102 may include a rear cover 114 defining a rear exterior surface of the oven body 103. The rear cover 114 may be configured to be detachably coupled to the outer cover 108 and/or the top cover 102. Various components of the oven body 103 (e.g., outer cover 108, top cover 110, rear cover 114) may be formed using any material known in the art. For example, the outer cover 108, top cover 110, and/or rear cover 114 may be formed from sheets of aluminum. In embodiments, the aircraft galley oven 102 may include one or more ports/couplers 116 configured to couple the aircraft galley oven 102 to various other sources or systems (e.g., electricity sources, compressed air sources, and the like).

Figure 4C:
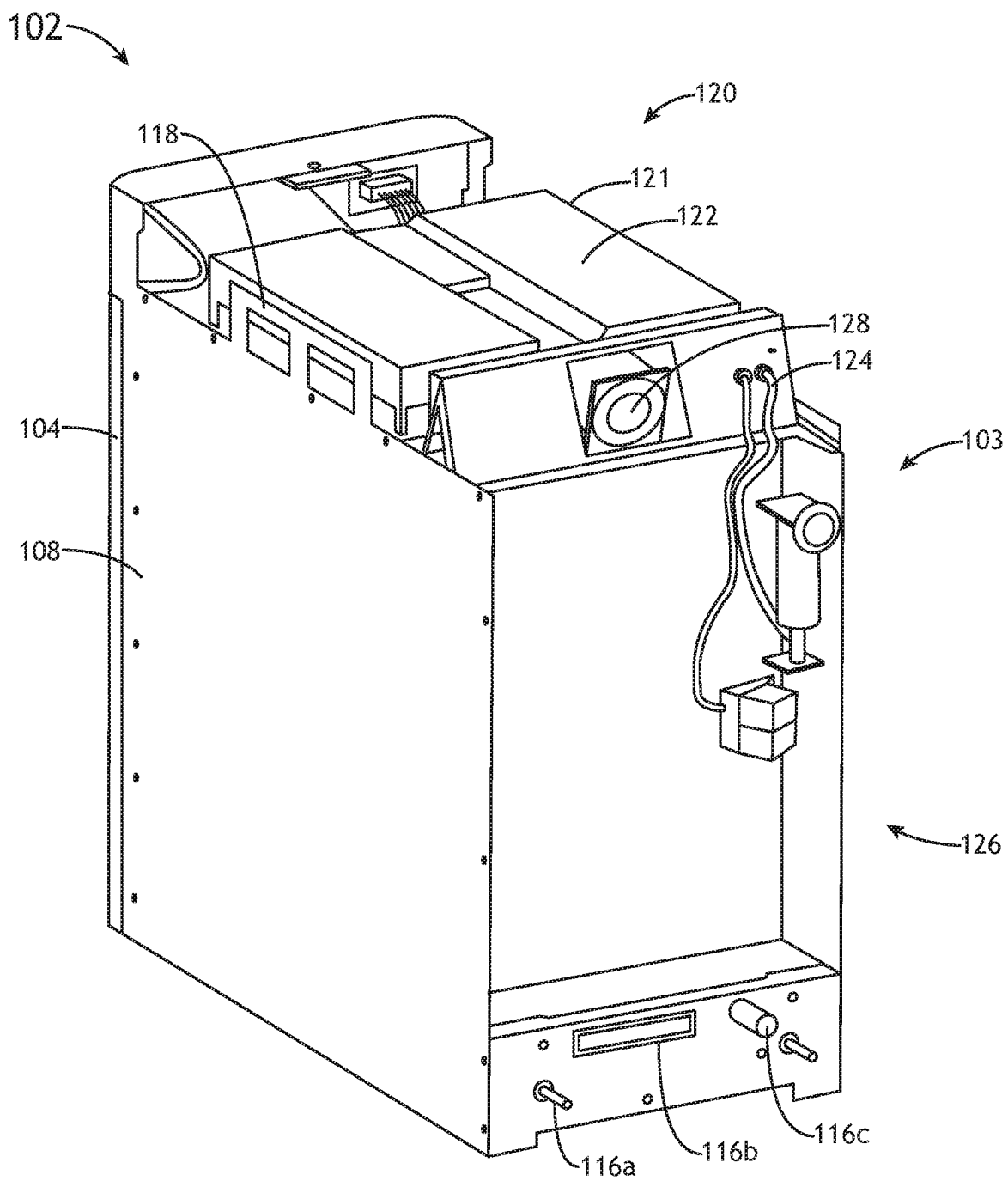
FIG. 4C illustrates a rear perspective view of an aircraft oven including an oven control unit, in accordance with an example embodiment of the present disclosure.

FIG. 4C illustrates a rear perspective view of an aircraft galley oven 102 including a control unit 120, in accordance with an example embodiment of the present disclosure. More particularly, FIG. 4C illustrates a rear perspective view of the aircraft galley oven 102 with the top cover 110 and the rear cover 114 removed from the oven body 103. As shown in FIG. 4C, aircraft galley oven 102 may include, but is not limited to, an aircraft body 103, a control unit 120, one or more operating load components 126, and one or more fans 128.

In embodiments, the control unit 120 includes one or more electronic components within a control unit housing 121 configured to operate the various functions of the aircraft galley oven 102. For example, the control unit 120 may include one or more electronic components disposed on a printed circuit board within a control unit housing 121. Electrical components of the control unit 120 may include, but are not limited to, power supply modules, transistors, resistors, and electrical circuits configured to carry out the various functions of the aircraft galley oven 102. In additional embodiments, the control unit 120 includes a control unit housing 121 configured to contain and/or protect the electronic components of the aircraft oven (e.g., contain the printed circuit board including electronic components). For example, in embodiments, control unit housing 121 may include a base plate 122 which defines at least a portion of the control unit housing 121.

The control unit 120 may be mounted and/or coupled to the oven body 103. In embodiments, the control unit 120 is coupled to the outer cover 108. For example, the control unit housing 121 of the control unit 120 may be coupled to the outer cover 108. For instance, the base plate 122 of the control unit housing 121 may be coupled to the outer cover 108. In further embodiments, the control unit 120 (e.g., control unit housing 121) may be coupled to one or more faying surfaces 118 of the outer cover 108. As will be described in further detail herein, the base plate 122 of the control unit housing 121 may be coupled to the outer cover 108 in such a manner as to increase the contact surface area between the base plate 122 (e.g., control unit housing 121) and the outer cover 108. It is contemplated that, by increasing the contact surface area between the control unit housing 121 and the outer cover 108, the control unit housing 121 may optimize a grounding return path for high-frequency noise (e.g., RE) back to the electrical components of the control unit 120.

As noted previously herein, embodiments of the present disclosure are directed to an optimized grounding path for electronic devices, wherein the optimized grounding path provides an efficient return path for noise (RE) to return to the sources of EMI within the control unit 120. In particular, embodiments of the present disclosure are directed to an optimized return path which decreases the length of noise grounding paths back to sources of EMI within the control unit 120. Further embodiments of the present disclosure are directed to an optimized return path which provides low resistance for high frequencies along a return path to the control unit 120.

In embodiments, the aircraft galley oven 102 includes one or more electrical lines 124 (e.g., wiring, wires, traces, and the like) configured to communicatively couple the electrical components of the control unit 120 to various other operating load components 126 of the aircraft galley oven 102. Generally speaking, electrical component of the control unit 120 may be regarded as electrical power "sources," whereas operating load components 126 may be regarded as electrical "loads," as shown and described in FIG. 2. Operating components 126 may include any components known in the art for operating an oven including, but not limited to, one or more heating elements, one or more compressors, one or more pumps, one or more valves, and the like. In this regard, the term "operating load components 126" may be regarded as referring to any components of an electronic device (e.g., aircraft galley insert, aircraft galley oven 102, and the like) which are communicatively coupled (either directly or indirectly) to the electrical components within the control unit 120. The aircraft galley oven 102 may further include one or more fans 128 configured to cool and maintain an operating temperature of the control unit 120.

Figure 5:
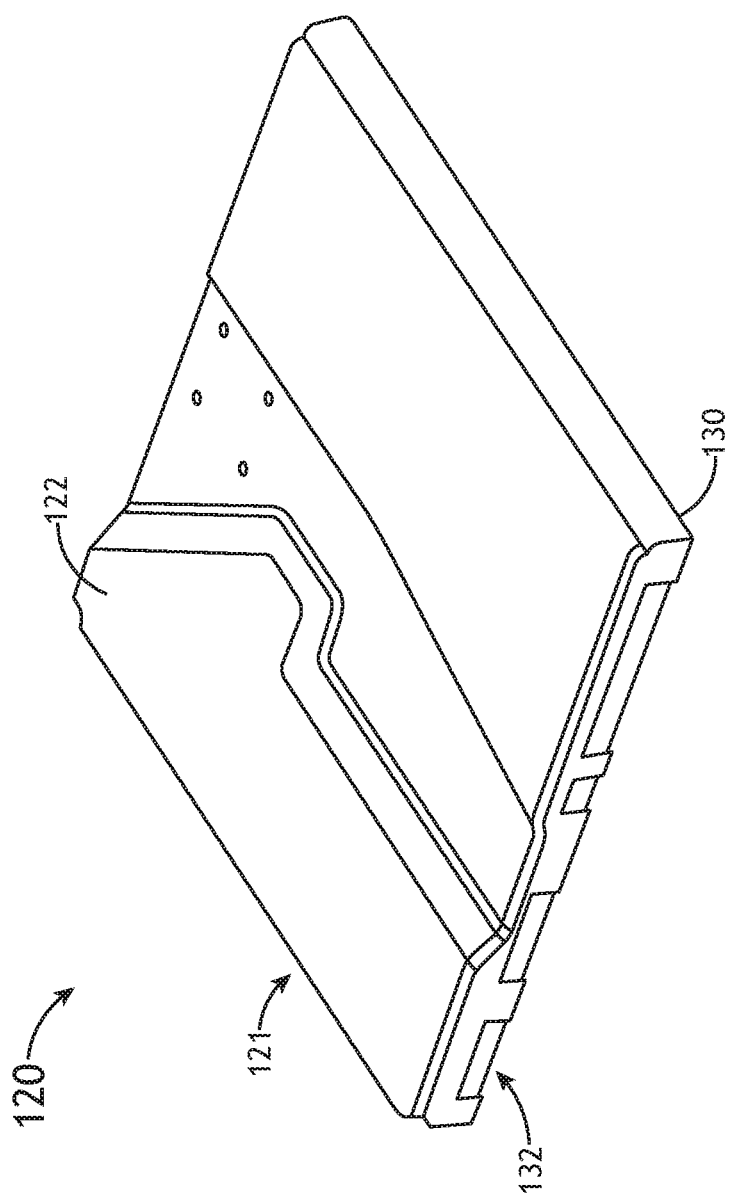
FIG. 5 illustrates an oven control unit, in accordance with an example embodiment of the present disclosure.

FIG. 5 illustrates a control unit 120, in accordance with an example embodiment of the present disclosure. The control unit 120 may include, but is not limited to, a control unit housing 121 and one or more electrical components disposed on a printed circuit board (PCB) within the control unit housing 121.

The control unit housing 121 may include, but is not limited to, a base plate 122 coupled to a control unit cover 130. The base plate 122 may be coupled and/or mounted to the control unit cover 130 using any technique known in the art. In embodiments, the control unit housing 121 (e.g., base plate 122, control unit cover 130, and the like) is configured to contain the printed circuit board upon which one or more electrical components of the aircraft galley oven 102 are disposed. Additionally, the control unit cover 130 may be configured to close off the control unit 120 in order to keep radiation within the control unit 120, as well as keep dust, moisture, and debris out of the control unit 120. It is contemplated herein that the base plate 122 may be formed from any material known in the art which is configured to provide a low resistance return path for EMI noise (e.g., RE) back to the one or more electrical components disposed on the PCB. In this regard, the base plate 122 may be formed from, but is not limited to, aluminum, steel, titanium, and the like. For example, base plate 122 may include a single machined or casted aluminum structure. Furthermore, it is contemplated herein that the control unit housing 121 (e.g., the base plate 122 and the control unit cover 130) may be fabricated as a single structure (e.g., single machined or casted aluminum structure). By way of another example, the base plate 122 may be formed from a plastic which is made to be conductive via one or more conductive coatings or conductive fibers.

The control unit 120 may further include one or more ports 132 configured to receive the one or more electrical lines 124 (FIG. 4C) configured to communicatively couple the one or more electrical components within the control unit 120 to the various other operating load components 126 of the aircraft galley oven 102. As noted previously herein, the one or more electrical components within the control unit 120 may be coupled to one or more operating load components 126 via one or more conductive coupling structures including, but not limited to, the control unit housing 121, the outer cover 108, a conductive structural component, and the like.

Figure 6:
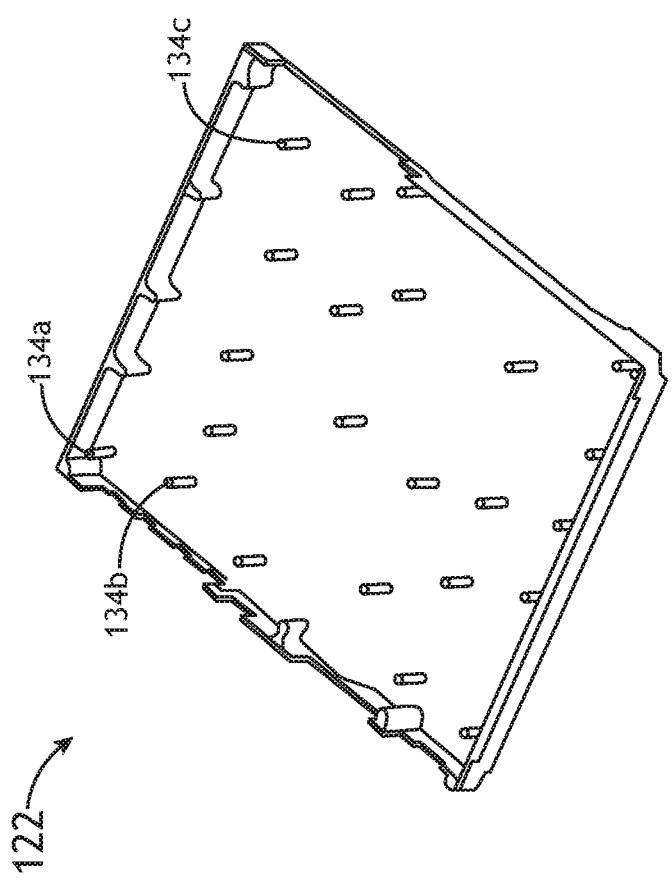
FIG. 6 illustrates a bottom view of a base plate of an oven control unit, in accordance with an example embodiment of the present disclosure.
Figure 7:
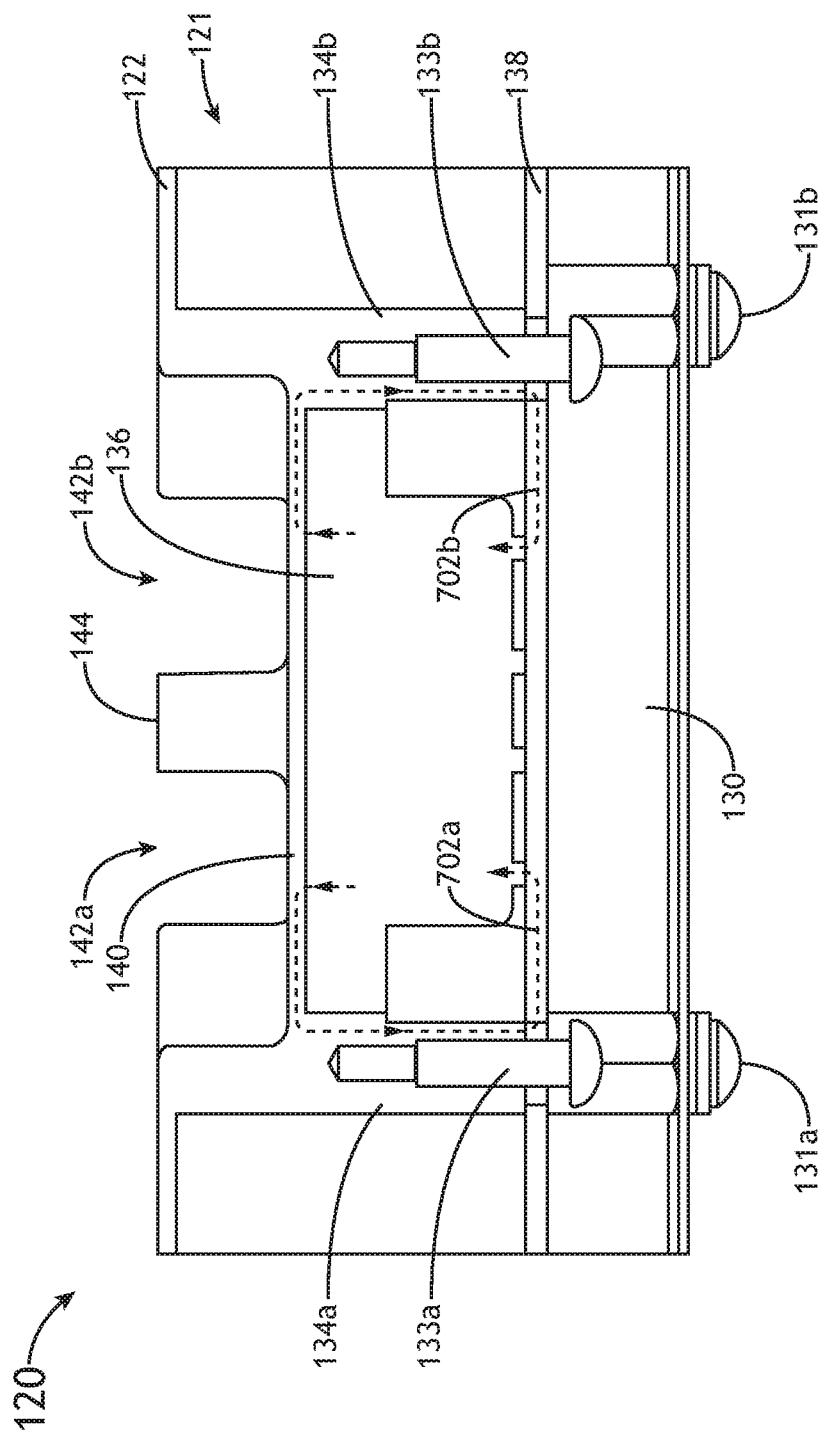
FIG. 7 illustrates a cross sectional view of an oven control unit, in accordance with an example embodiment of the present disclosure.

FIG. 6 illustrates a bottom view of a base plate 122 of a control unit housing 121, in accordance with an example embodiment of the present disclosure. In embodiments, the base plate 122 may be formed from a single machined or casted piece of aluminum. In embodiments, the base plate 122 (e.g., aluminum base plate 122) may be treated with a non-anodized conductive outer layer to facilitate electrical coupling with one or more components of the control unit 120. The non-anodized conductive layer may include any non-anodized conductive layer known in the art including, but not limited to, SurTec coatings. In additional embodiments, the base plate 122 may include one or more stand-offs 134. For example, the base plate 122 may include a first stand-off 134a, a second stand-off 134b, a third stand-off 134c, and the like. In embodiments, the base plate 122 may be coupled to a PCB 138 (shown in FIG. 7) within the control unit 120 at the one or more stand-offs 134. For example, as shown in FIGS. 6 and 7, the one or more stand-offs 134 may be configured to receive fasteners (e.g., bolts, screws, pins, or the like) in order to couple the base plate 122 to the PCB 138. It is contemplated herein that the one or more stand-offs 134 may allow the base plate 122 to be coupled to the PCB 138 while also providing sufficient space for the electronic components disposed on the PCB 138. In additional and/or alternative embodiments, it is contemplated herein that the base plate 122 and the control unit cover 130 of the control unit housing 121 may be formed as a single piece to house the components of the control unit 120. In this regard, the control unit housing 121 may include a single piece. The base plate 122 and stand-offs 134 will be discussed in further detail with respect to FIG. 7.

FIG. 7 illustrates a cross sectional view of a control unit 120, in accordance with an example embodiment of the present disclosure. As shown in FIG. 5, control unit 120 may include, but is not limited to, a control unit housing 121 and a power supply module 136 disposed on a printed circuit board (PCB 138). The control unit housing 121 may include a base plate 122 and a control unit cover 130.

As noted previously herein, electronic components of appliances (e.g., aircraft galley oven 102) and other electronic devices commonly generate electromagnetic interference (EMI). In particular, electronic components of the aircraft galley oven 102 emit high-frequency noise. Providing sufficient grounding paths in order to control, reduce, and/or stabilize high-frequency noise (e.g., RE) emitted by these electronic components is particularly important, especially in the aircraft context. Thus, the creation of efficient and optimized noise grounding paths to return radiated emissions (RE) to electronic components is particularly important.

It has been found that power supply modules are one of the highest contributors of EMI and high-frequency noise out of the electronic components of the control unit 120. In this regard, the one or more electronic components disposed on the PCB 138 within the control unit 120 is illustrated in FIG. 7 as a power supply module 136 disposed on the PCB 138. In this regard, the power supply module 136 may be considered as an example of an "electronic component" of the control unit 120 which produces EMI and RE. It is further noted, however, that embodiments of the present disclosure may be applied to other electronic components in addition to, or in the alternate to, the power supply module 136.

The power supply module 136 may be regarded as an electrical power "source" which is electrically coupled to one or more operating load components 126 of the aircraft galley oven 102 via one or more electrical lines 124, as shown and described in FIGS. 2 and 4C. Furthermore, embodiments of the present disclosure are directed to coupling the power supply module 136 and the one or more operating load components 126 of the aircraft galley oven 102 via one or more conductive coupling structures including (e.g., control unit housing 121, outer cover 108, conductive structural component of the aircraft galley oven 102, and the like). It is contemplated herein that providing a defined grounding path between the one or more operating load components 126 and the power supply module 136 via one or more conductive coupling structures may reduce the controlled RE/RS area within the aircraft galley oven 102, reduce EMI emissions of the aircraft galley oven 102, and improve the radiated susceptibility (RS) of the aircraft galley oven 102.

As noted previously herein with respect to FIG. 2, some embodiments of the present disclosure are directed to coupling a source (e.g., one or more electrical components of control unit 120) and a load (e.g., one or more operating load components 126) of an electronic device to one or more conductive coupling structures in order to create a known, controlled RE/RS area for radiated emissions (RE) to return to the source. In embodiments, a source and load may be coupled to one or more conductive coupling structures using any coupling technique known in the art including, but not limited to, capacitive coupling (shown in FIG. 2), conductive coupling, and the like. In embodiments, an electrical component of the control unit 120 may be coupled to an operating load component of the aircraft galley oven 102 (illustrated in FIG. 4C) via one or more conductive coupling structures including, but not limited to, a control unit housing 121, an outer cover 108, a conductive structural component (e.g., bracket, chassis, frame, mount), and the like. For example, the power supply module 136 of the control unit 120 may be coupled to a load (operating load component 126) of the aircraft galley oven 102 via the control unit housing 121 and the outer cover 108. For instance, the power supply module 136 may be directly coupled to the control unit housing 121 (e.g., capacitively coupled, conductively coupled), the operating load component 126 may be directly coupled to the outer cover 108 (e.g., capacitively coupled, conductively coupled), and the outer cover 108 may be directly coupled to the control unit housing 121 (e.g., capacitively coupled, conductively coupled).

Embodiments of the present disclosure are directed to an optimized grounding and/or bonding path for high-frequency noise (RE) for aircraft galley oven 102 electronic components. In particular, embodiments of the present disclosure are directed to a grounding path for high-frequency noise (RE) which decreases the overall length of the grounding path, decreases the number of surface jumps between structures along the grounding path, and increases the surface area of contacts between structures along the bonding path. Additional embodiments of the present disclosure are directed toward a grounding path along one or more conductive coupling structures (e.g., control unit housing 121, outer cover 108, conductive structural component, and the like) which provides an efficient grounding path for high frequency noise (RE) to return from one or more operating load components 126 to electronic components (e.g., power supply module 136) of the control unit 120. It is noted herein that embodiments of the present disclosure may reduce the size of uncontrolled areas which introduce RE into the system. In this regard, embodiments of the present disclosure are directed to an optimized grounding path which will reduce and stabilize EMI generated by electronic components (e.g., power supply module 136) of the aircraft galley oven 102.

In embodiments, the control unit housing 121 includes the base plate 122 coupled to the control unit cover 130. For example, as shown in FIG. 7, the base plate 122 may be coupled to the control unit cover 130 via one or more fasteners 131. The one or more fasteners 131a, 131b may include any fasteners known in the art including, but not limited to, one or more bolts, one or more screws, one or more pins, and the like. In an additional and/or alternative embodiment, the base plate 122 may be coupled to the control unit cover 130 via one or more adhesives. As noted previously herein, in additional and/or alternative embodiments, the base plate 122 and the control unit cover 130 of the control unit housing 121 may be formed from as a single structure (e.g., single-structure control unit housing 121). In additional embodiments, the control unit housing 121 (e.g., base plate 122) may further be coupled to the PCB 138. For example, the base plate 122 may be coupled to the PCB 138 via one or more fasteners 133. Similarly, the one or more fasteners 133a, 133b may include any fasteners known in the art including, but not limited to, one or more bolts, one or more screws, one or more pins, and the like.

As noted previously herein, the base plate 122 may be coupled to the PCB 138 at the one or more stand-offs 134a, 134b. For example, as shown in FIG. 7, a first fastener 133a may be configured to couple the PCB 138 to the base plate 122 at a first stand-off 134a, and a second fastener 133b may be configured to couple the PCB 138 to the base plate 122 at a second stand-off 134b. In embodiments, the inclusion of stand-offs 134 within the base structure 122 may allow for the base plate 122 to be mounted directly to the PCB 138 such that the base plate 122 and/or stand-offs 134 are positioned directly adjacent to the power supply module 136 (and other electronic components). For example, as shown in FIG. 7, the one or more stand-offs 134 may allow the base plate 122 to be coupled to the PCB 138 such that a bottom surface 140 of the control unit housing 121 (e.g., bottom surface 140 of base plate 122) is positioned directly adjacent to the power supply module 136. In embodiments, the bottom surface 140 may be positioned directly on and/or adjacent to the power supply module 136 such that nothing is between the power supply module 136 and the bottom surface 140 of the control unit housing 121 (e.g., base plate 122).

In embodiments, the control unit housing 121 (e.g., base plate 122, control unit cover 130) is configured to facilitate an optimized electrical grounding path for high-frequency noise (RE) and other EMI emitted by the power supply module 136. The control unit housing 121 may provide a guiding path for current/noise which does not travel within power and return wires (e.g., radiated emissions (RE)) to travel back to electronic components of the control unit 120. In embodiments, the control unit housing 121 (e.g., base plate 122) may be configured to increase contact surfaces between the bottom surface 140 and the power supply module 136 in order to facilitate coupling (e.g., capacitive coupling, conductive coupling, and the like) between the control unit housing 121 (e.g., base plate 122) and the power supply module 136 (and other electronic components). This may serve to provide a coupling (e.g., capacitive coupling, conductive coupling, and the like) between a load (e.g., valve, pump, motor, human-machine interface, and the like) and a source (e.g., power supply module 136) of an aircraft galley oven 102 in order to limit and control the area of the aircraft galley oven 102 subject to RE and RS, thereby reducing unwanted EMI and increasing radiated susceptibility (RS) of the aircraft galley oven 102.

For example, FIG. 7 illustrates example paths 702a, 702b of high-frequency emissions and EMI emitted from the power supply module 136 and returned back to the power supply module 136 via one or more components of the control unit 120. As shown in FIG. 7, EMI emitted from the power supply module 136 may be emitted along paths 702a, 702b and captured by bottom surface 140 of the control unit housing 121 (e.g., bottom surface 140 of base plate 122). The EMI may then be directed within the control unit housing 121 to the one or more stand-offs 134a, 134b. Subsequently, the EMI may be returned to the power supply module 136 along paths 702a, 702b via the PCB 138. It is noted herein that the control unit 120 may be configured to direct EMI back to the power supply module 136 along any number of paths. Accordingly, the paths 702a, 702b illustrated in FIG. 7 are provided solely for example.

In particular, it is noted that the high-frequency noise emitted by the power supply module 136 and other electronic components may be readily transmitted from the control unit housing 121 (e.g., base plate 122) back to the power supply module 136 via capacitive coupling, conductive coupling, and the like. As noted previously herein, previous traditional aircraft ovens 102 and other appliances are not designed and/or manufactured to include control units and/or grounding paths with sufficient contact surfaces to enable sufficient coupling for the grounding path. As such, traditional aircraft ovens 102 typically require alterations and retrofitting (e.g., copper tape, copper coating, partial re-designs) in order to maintain compliance with all applicable regulations. Comparatively, embodiments of the present disclosure are configured to maintain regulatory compliance by implementing sufficient grounding paths within the mechanical structure of the aircraft oven 102. In this regard, by increasing the contact surfaces between the control unit housing 121 and electronic components (e.g., power supply module 136), embodiments of the present disclosure may provide an improved EMI grounding path over previous approaches.

It is contemplated herein that a single-piece control unit housing 121 and/or single-piece base plate 122 may allow for small coupling loops proximate to high emissive components in order to control and/or reduce noise emissions from electronic components (e.g., power supply module 136). Furthermore, by positioning a bottom surface 140 of the control unit housing 121 (e.g., bottom surface 140 of the base plate 122) directly adjacent and/or in contact with the electronic components (e.g., power supply module 136) disposed on the PCB 138, the control unit housing 121 may allow for noise filtering directly at the source, thereby decreasing the grounding path length back to the power supply module 136, reducing the return loop size, and reducing the related antenna effect. Additionally, by positioning surfaces of the control unit housing 121 (e.g., surfaces of the base plate 122) proximate and/or in contact with surfaces of the power supply module 136, the coupling area may be increased (e.g., capacitive coupling area, conductive coupling area, and the like), and the antenna area between the control unit housing 121 and the power supply module 136 may be decreased. The control unit housing 121 (e.g., base plate 122) may provide minimal impedance from the outer cover 108 to the PCB 138, thereby improving the feedback loop for high-frequency noise (RE) and reducing the electromagnetic emissions generated by the aircraft galley oven 102.

In additional embodiments, the control unit housing 121 (e.g., base plate 122) may serve as a heat sink for the electronic components (e.g., power supply module 136) of the control unit 120. In this regard, the base plate 122 may be formed from a substance with a high thermal conductivity, such aluminum. In order to further facilitate the removal of heat from the control unit 120. The control unit housing 121 (e.g., base plate 122) may include one or more features/structures configured to facilitate heat dissipation away from the electronic components. For example, as shown in FIG. 7, the base plate 122 may include one or more vents 142a, 142b. The one or more vents 142a, 142b may be positioned proximate to the power supply module 136 in order to facilitate heat transfer. The one or more vents 142a, 142b may be configured to increase the surface area of the control unit housing 121 on the exterior of the control unit 120, and thereby facilitate heat transfer. As shown in FIG. 4C, one or more fans 128 may be configured to direct air along the control unit 120 (e.g., along a top surface of the control unit housing 121) in order facilitate heat transfer. In this regard, the one or more vents 142a, 142b may increase the surface area of the control unit housing 121 which is exposed to ambient air and/or moving air directed from the one or more fans 128. It is noted herein that the base plate 122 may include any other features/structures known in the art to facilitate heat transfer. For example, as shown in FIG. 7, the base plate 122 may include one or more baffles and/or fins 144.

It is contemplated herein that fabricating the control unit housing 121, base plate 122, heat sink, and one or more stand-offs 134 as a single structure may reduce the number of surface transitions along the grounding path, as compared to previous approaches. Additionally, by fabricating the control unit housing 121, base plate 122, heat sink, and one or more stand-offs 134 as a single structure, the grounding/coupling path for current/noise (e.g., EMI/RE) back to the electronic components of the control unit 120 may be defined, known, and optimized, thereby creating a small and controlled grounding path.

Figure 8:
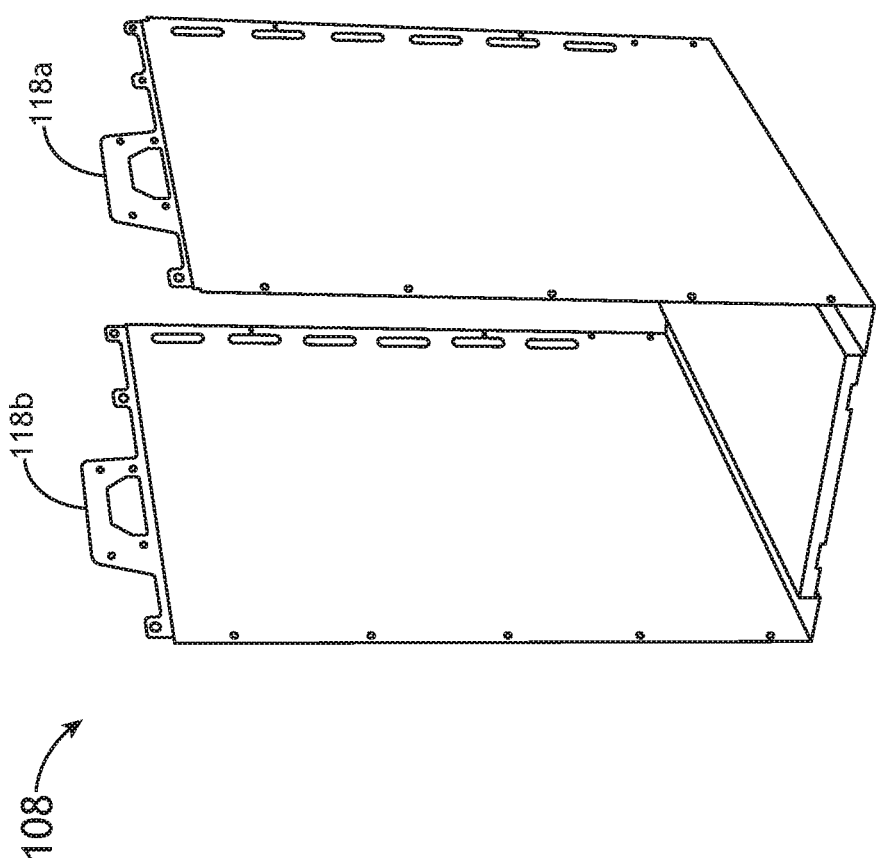
FIG. 8 illustrates an outer cover of an aircraft oven, in accordance with an example embodiment of the present disclosure.

FIG. 8 illustrates an outer cover 108 of an aircraft galley oven 102, in accordance with an example embodiment of the present disclosure. As shown in FIG. 8, the outer cover 108 may be formed from a single piece of sheet metal. For example, the outer cover 108 may be formed from a single piece of aluminum. In embodiments, the outer cover 108 may define at least a portion of first side surface, a second side surface, and a bottom surface of the aircraft galley oven 102.

In embodiments, the outer cover 108 may include one or more faying surfaces 118. For example, the outer cover 108 may include a first faying surface 118a on the first side surface of the outer cover 108, and a second faying surface 118b on the second side surface of the outer cover 108. As shown previously in FIG. 4C, the outer cover 108 may be configured to be couplable to the control unit housing 121 (e.g., base plate 122, control unit cover 130, and the like) of the control unit 120 at the first faying surface 118a and/or the second faying surface 118b. In additional embodiments, the outer cover 108 may include one or more holes configured to receive one or more fasteners in order to couple the outer cover 108 to various other components of the aircraft galley oven 102 (e.g., control unit housing 121, base plate 122, top cover 110, rear cover 114, and the like). In additional embodiments, the outer cover 108 may be powder coated in order to provide a protective coating for the outer cover 108 and the aircraft galley oven 102.

In embodiments where the outer cover 108 is powder coated, it is contemplated herein that the portions of the outer cover 108 which are to be coupled to the control unit housing 121 (e.g., portions of outer cover 108 in electrical contact with the base plate 122) may not be powder coated in order to avoid introducing resistance along the grounding path. For example, in embodiments where the base plate 122 of the control unit housing 121 is coupled to the outer cover 108 at the first faying surface 118a and the second faying surface 118b, at least portions of the first faying surface 118a and the second faying surface 118b may not be powder coated. Furthermore, in additional embodiments, portions of the outer cover 108 which are in electrical contact with the control unit housing 121 may be treated with a conductive surface finish in order to prevent corrosion, and thus prevent degradation of the grounding path. For example, continuing with the example above, the first faying surface 118a and the second faying surface 118b may be treated with a conductive surface finish, while at least a portion of the remainder of the outer cover 108 may be powder coated.

Figure 9:
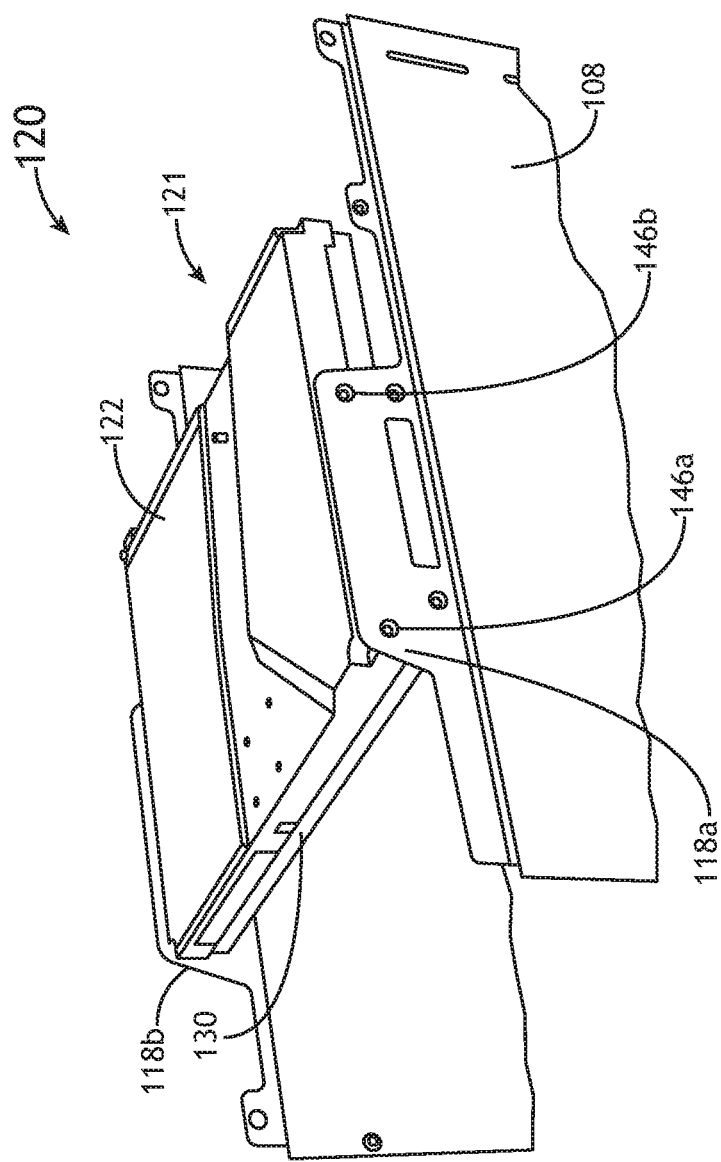
FIG. 9 illustrates an outer cover of an aircraft galley oven coupled to a control unit housing of a control unit, in accordance with an example embodiment of the present disclosure.

FIG. 9 illustrates an outer cover 108 of an aircraft galley oven 102 coupled to a control unit housing 121 of a control unit 120, in accordance with an example embodiment of the present disclosure.

In embodiments, the control unit housing 121 (e.g., base plate 122, and the like) of the control unit 120 is coupled to the outer cover 108. For example, as shown in FIG. 9, the base plate 122 may be coupled to the outer cover 108 at the first faying surface 118a and/or the second faying surface 118b. The control unit housing 121 (e.g., base plate 122) may be coupled to the outer cover 108 using one or more fasteners 146. The one or more fasteners 146a, 146b may include any fasteners known in the art including, but not limited to, one or more bolts, one or more screws, one or more pins, and the like. The one or more fasteners 146 may be configured to securely couple the control unit 120 to the one or more faying surfaces 118a, 118b.

The control unit housing 121 may be coupled to the outer cover 108 (e.g., first faying surface 118a, second faying surface 118b) in such a manner as to increase and/or optimize the surface area of the surface contact between the control unit housing 121 (e.g., base plate 122) and the outer cover 108. As noted previously herein, increasing the surface contact between the control unit housing 121 and the outer cover 108 may facilitate coupling (e.g., capacitive coupling, conductive coupling, or the like) for the transfer of high-frequency noise (RE) from the outer cover 108 to the control unit housing 121. Furthermore, increasing the surface area of contact between the control unit housing and the outer cover 108 may facilitate an efficient electrical grounding/bonding path, thereby providing an improved grounding path over previous aircraft ovens. In this regard, radiated signals (e.g., RE) may be transferred from the outer cover 108 to the control unit housing 121 and back to the electronic components (e.g., power supply module 136) of the control unit 120 in a guided, controlled grounding path.

As noted previously herein, in embodiments, one or more electronic components of the control unit 120 ("electric power source") (e.g., power supply module 136) may be coupled to one or more operating load components 126 of the aircraft galley oven 102 via one or more conductive coupling structures including (e.g., control unit housing 121, outer cover 108, conductive structural component of the aircraft galley oven 102, and the like). For example, the power supply module 136 may be coupled to the control unit housing 121, and an operating load component 126 of the aircraft galley oven 102 (e.g., pump, valve, HMI, heating element, cooling element, and the like) may be directly coupled to the control unit housing 121. In this example, the one or more conductive coupling structures include the control unit housing 121. By way of another example, the power supply module 136 may be coupled to the control unit housing 121, an operating load component 126 of the aircraft galley oven 102 (e.g., pump, valve, motor, HMI, heating element, cooling element, and the like) may be directly coupled to the outer body 108, and the outer cover 108 may be coupled to the control unit housing 121 at the one or more faying surfaces 118. In this example, the one or more conductive coupling structures include the control unit housing 121 and the outer cover 108.

It is noted herein that the configuration of the electrical grounding/bonding path of the present disclosure may provide a number of advantages over the grounding paths of previous electronic devices, including aircraft galley inserts (e.g., aircraft galley oven 102). For example, previous aircraft galley inserts utilize a large number of components within the grounding path between electric sources and loads within the aircraft galley inserts. In addition to creating a long grounding path, and thereby increasing electrical resistance, a large number of components within the grounding path leads to an undefined and uncontrolled grounding path back to the electrical source, thereby increasing the area contributing to RE and decreasing the radiated susceptibility (RS) of the aircraft galley insert. Comparatively, the grounding path of the present disclosure may include only two components along the grounding path: (1) the control unit housing 121 (e.g., base plate 122), and (2) the outer cover 108. Furthermore, the grounding path of the present disclosure may include only two surface jumps: (1) from the electronic components to the control unit housing 121 (e.g., base plate 122), and (2) from the control unit housing 121 (e.g., base plate 122) to the outer cover 108. Fewer numbers of components and surface jumps along the grounding path allow the grounding path of the present disclosure to more efficiently and effectively control, stabilize, and reduce electromagnetic emissions generated by electronic components of the aircraft galley oven 102. It is noted herein that previous grounding paths do not utilize an outer cover 108 such that it contributes to the optimization of a grounding path for current/noise back to electronic components of the control unit 120. In this regard, embodiments of the present disclosure are directed to the use of the outer cover 108 and control unit housing 121 to provide for short, defined, and controlled guided paths for electrical noise to return to electrical components (e.g., power supply module 136) of the control unit 120.

By way of another example, due to spatial constraints and other limitations, previous aircraft ovens 102 utilize small contact surfaces (e.g., small surface areas) along the grounding path. These small contact surfaces limit capacitive coupling along the grounding path, and limit the efficiency of the grounding path. Comparatively, the grounding path of the present disclosure is configured to increase the contact surfaces along the grounding path (e.g., between the electronic components and the control unit housing 121, between the control unit housing 121 and the outer cover 108, and the like) in order to increase capacitive coupling along the grounding path, and to efficiently reduce the EMI noise generated by the aircraft galley oven 102.

Figure 10:
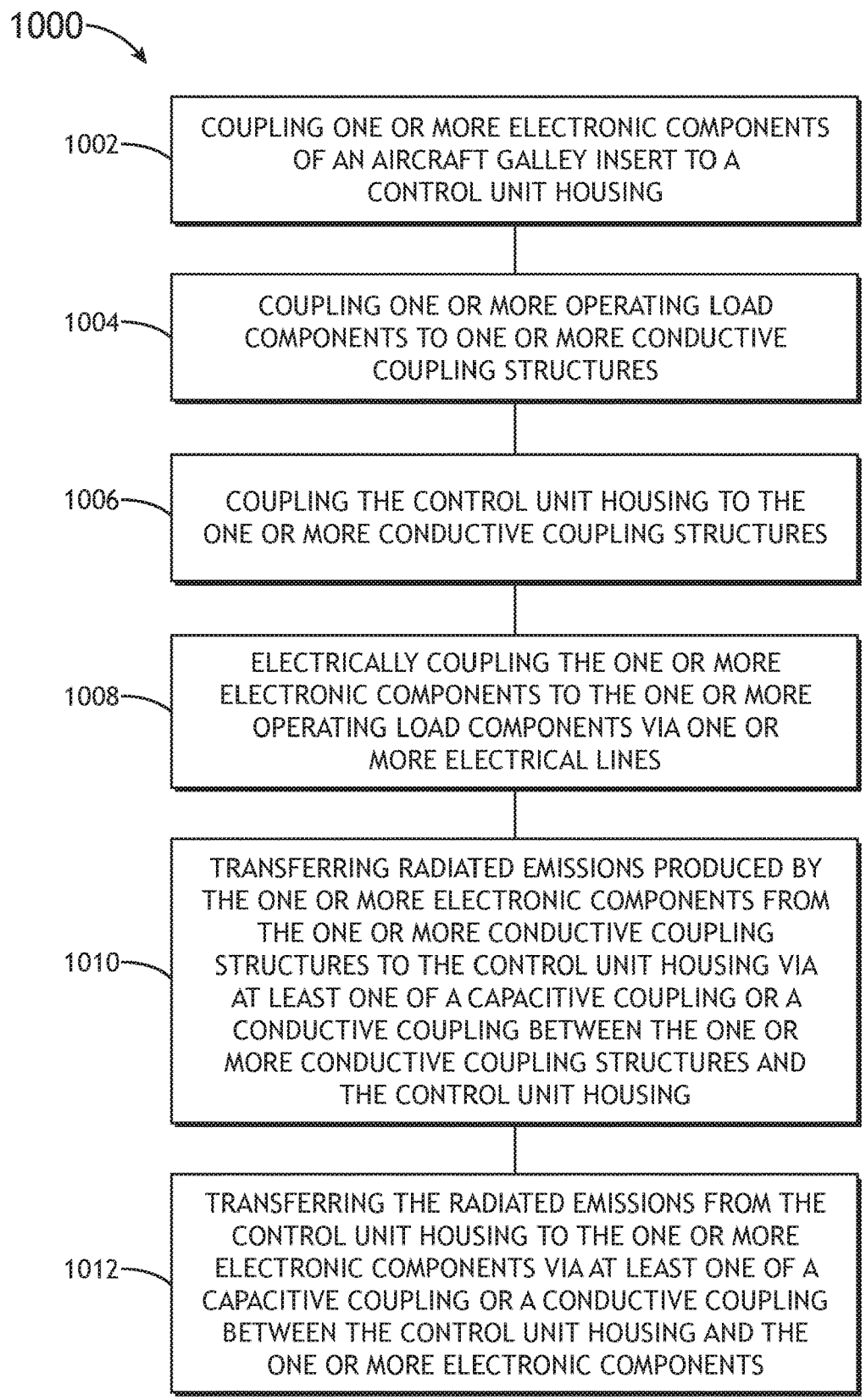
FIG. 10 illustrates a flowchart of a method for an optimized grounding path of an aircraft galley insert, in accordance with one or more embodiments of the present disclosure.

FIG. 10 illustrates a flowchart of a method for an optimized grounding path of an aircraft galley insert (e.g., aircraft galley oven 102), in accordance with one or more embodiments of the present disclosure.

In a step 1002, one or more electronic components of an aircraft galley insert are coupled to a control unit housing. For example, a power supply module 136 (e.g., electronic component) of an aircraft galley oven 102 may be coupled to a control unit housing 121. The power supply module 136 may be coupled to the control unit housing 121 via any coupling mechanism known in the art including, but not limited to, capacitive coupling, conductive coupling, and the like.

In a step 1004, one or more operating load components of an aircraft galley insert are coupled to one or more conductive coupling structures. The one or more operating load components 126 may include any components configured to carry out the various functions of the aircraft galley insert including, but not limited to, a pump, a valve, a motor, an HMI, a heating element, a cooling element, and the like. Similarly, the one or more conductive coupling structures may include, but are not limited to, the control unit housing 121, an outer cover 108, a conductive structural component (e.g., bracket, chassis, frame, mount, and the like), and the like. The one or more operating load components 126 may be coupled to the one or more conductive coupling structures via any coupling mechanism known in the art including, but not limited to, capacitive coupling, conductive coupling, and the like.

In a step 1006, the control unit housing is coupled to the one or more conductive coupling structures. The control unit housing 121 may be coupled to the one or more conductive coupling structures via any coupling mechanism known in the art including, but not limited to, capacitive coupling, conductive coupling, and the like. However, in embodiments where the one or more conductive coupling structures include the control unit housing 121 itself (e.g., the one or more operating load components 126 are coupled directly to the control unit housing 121), it is noted herein that step 1006 may not be necessary.

In a step 1008, the one or more electronic components are electrically coupled to the one or more operating load components via one or more electrical lines. For example, as shown in FIG. 4C, the one or more electronic components (e.g., power supply module 136) may be coupled to the one or more operating load components 126 via one or more electrical lines 124.

In a step 1010, radiated emissions produced by the one or more electronic components are transferred from the one or more conductive coupling structures to the control unit housing via at least one of a capacitive coupling or a conductive coupling between the one or more conductive coupling structures and the control unit housing.

In a step 1012, the radiated emissions are transferred from the control unit housing to the one or more electronic components via at least one of a capacitive coupling or a conductive coupling between the control unit housing and the one or more electronic components within the control unit housing.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed is:

1. An aircraft galley insert, comprising:
a control unit including a control unit housing, the control unit housing comprises a base plate coupled to a control unit cover, the base plate comprises at least one of a molded aluminum structure, a casted aluminum structure, a titanium structure, or a steel structure, wherein the base plate includes one or more stand-offs, wherein the base plate is coupled to a printed circuit board at the one or more stand-offs;
one or more electronic components on the printed circuit board and at least partially contained within the control unit housing, wherein at least one electronic component of the one or more electronic components is coupled to the control unit housing and the one or more electronic components is directly adjacent or in contact with the base plate; and
one or more operating load components electrically coupled to the at least one electronic component via one or more electrical lines,
wherein the control unit housing is configured to provide a grounding path for radiated emissions produced by the at least one electronic component by transferring radiated emissions through the one or more stand-offs to the printed circuit board and back to the at least one electronic component, the control unit housing is further configured to thermally couple to the at least one electronic component and dissipate heat from the at least one electronic component.

2. The aircraft galley insert of claim 1, wherein the at least one electronic component is coupled to the control unit housing via at least one of a capacitive coupling or a conductive coupling.

3. The aircraft galley insert of claim 1, further comprising one or more conductive coupling structures coupled to the control unit housing.

4. The aircraft galley insert of claim 3, wherein the one or more conductive coupling structures comprise an outer cover.

5. The aircraft galley insert of claim 4, wherein the outer cover includes one or more faying surfaces, wherein the outer cover is coupled to the control unit housing by at least one of the one or more faying surfaces.

6. The system of claim 5, wherein the one or more faying surfaces are configured to increase a coupling area between the outer cover and the control unit housing.

7. The system of claim 5, wherein the one or more faying surfaces are treated with a conductive surface finish to prevent corrosion.

8. The aircraft galley insert of claim 1, wherein the one or more operating load components are coupled directly to the control unit housing.

9. The aircraft galley insert of claim 1, wherein the at least one electronic component comprises a power supply module.

10. The aircraft galley insert of claim 1, wherein the one or more operating load components comprises at least one of a pump, a valve, a motor, a human machine interface (HMI), a heating element, or a cooling element.

11. The aircraft galley insert of claim 1, wherein the aircraft galley insert comprises an aircraft galley oven.

12. The aircraft galley insert of claim 1, further comprising:
   a galley insert body installable in a galley of an aircraft, the galley insert body including an outer cover.

* * * * *